United States Patent [19]

Weber et al.

[11] Patent Number: 5,465,171

[45] Date of Patent: Nov. 7, 1995

[54] OPTICAL MODULATOR DEVICE USING A THIN FILM RESONATOR

[75] Inventors: Robert J. Weber, Boone, Iowa; Russell W.-C. Chung, San Diego; Yet-zen Liu, West Lake Village, both of Calif.

[73] Assignee: Iowa State University Research Foundation, Inc., Ames, Iowa

[21] Appl. No.: 334,674

[22] Filed: Nov. 4, 1994

[51] Int. Cl.$^6$ ........................................... G02F 1/11
[52] U.S. Cl. .................... 359/287; 359/247; 359/248; 372/12; 372/13; 372/50; 385/7; 385/9
[58] Field of Search ...................... 359/247, 260, 359/263, 248, 285, 286, 287; 372/50, 12, 13, 26; 385/7, 8, 9

[56] References Cited

U.S. PATENT DOCUMENTS 4,802,182  1/1989  Thornton et al. ................. 372/50

Primary Examiner—Georgia Y. Epps
Assistant Examiner—Dawn-Marie Bey
Attorney, Agent, or Firm—Flehr, Hohbach, Test, Albritton & Herbert

[57] ABSTRACT

An optical modulator device comprised of a semiconductor laser acoustically coupled to a thin film resonator is disclosed herein. The thin film resonator includes a piezoelectric crystal layer having first and second opposing surfaces, with the first opposing surface being in contact with a metallic electrode. The semiconductor laser is interposed between an acoustically reflective surface and the second surface of the thin film resonator. In a preferred implementation the acoustically reflective surface is defined by a submount underlying a substrate upon which is mounted the semiconductor laser.

A frequency modulator exhibiting an improved modulation index may be achieved by integrating a superlattice structure within the active region of the semiconductor laser. The superlattice structure will preferably include a cascaded stack of stacked pairs, each stack pair constituent being of a thickness equivalent to a multiple of one-half of the wavelength of optical emission produced by the semiconductor laser of the superlattice.

The optical device may also be implemented in the form of a phase modulator disposed to provide a phase-modulated optical output of predetermined frequency. Phase modulation is produced in the absence of appreciable frequency modulation by configuring the thin film resonator to be of a longitudinal length less than that of the semiconductor laser.

18 Claims, 7 Drawing Sheets

OPTICAL MODULATOR DEVICE USING A THIN FILM RESONATOR

FIELD OF THE INVENTION

The present invention relates generally to semiconductor laser devices, and more particularly to those operating as optical modulators.

BACKGROUND OF THE INVENTION

In the field of optical communications, research has been directed to the development of diode laser transmitters for use within fiber optic communications networks. Techniques have been devised for modulating both the intensity and the emission wavelength of the diode laser by varying the applied current. For example, digital coding of an optical input signal has been achieved by alternately turning the laser diode current on and off. However, such current modulation techniques may be unable to provide the modulation speed required for high capacity fiber optic networks.

As a consequence, other techniques of high-speed optical modulation relying upon modulators positioned in the path of optical emission from the laser source have been investigated. Unfortunately, the size and temperature sensitivity of such external modulators may render these devices inappropriate for certain fiber optic network applications.

In another approach, the emission frequency of a semiconductor laser is acoustically modulated using an ultrasonic wave. Frequency modulation via ultrasonic waves arises due to the pressure dependence of the dielectric constant of the laser active layer. For small pressures, such as are produced by ultrasonic waves, the shift in the spontaneous emission line is negligible and the behavior of the laser modes is governed entirely by the acoustical modulation of the dielectric constant. If alternating pressure is applied to the laser via ultrasonic waves, corresponding frequency modulation of the optical output is observed.

This type of acoustical modulation technique has been effected through an apparatus in which a quartz transducer is bonded to one side of a semiconductor injection laser, with the other side of the laser typically being bonded to a heat sink. See, for example, *Resolution of Sidebands in a Semiconductor Laser Frequency Modulated by Ultrasonic Waves;* IEEE Journal of Quantum Electronics, vol. Q3-6, No. 6, June 1970, pp. 352–355. Although capable of providing a limited degree of frequency modulation, such acousto-optic modulators have proven to be incompatible with semiconductor device planar processing techniques. That is, a separate processing step is required to externally attach the quartz transducer or like acoustical element to a lateral surface of the diode laser. Moreover, this separate processing renders such devices incapable of being monolithically integrated with other integrated circuit elements.

Perhaps more significantly, conventional acousto-optie modulation structures have not been shown to be capable of providing the type of high-frequency modulation required by various advanced optical communications and signal processing systems. Moreover, the modulation index associated with the modulated optical output of such conventional structures is generally less than would be desired to facilitate heterodyne detection and demodulation. Existing acousto-optie modulation structures are also not disposed to provide phase modulation in the absence of appreciable frequency modulation, thereby further restricting their utility within advanced optical systems.

OBJECTS OF THE INVENTION

Accordingly, one object of the invention is to provide a compact optical source capable of producing a high-speed frequency or phase-modulated optical output signal.

It is another object of the present invention that the optical modulator incorporate a laser diode having an active region comprised of a superlattice structure in order that a high modulation index be achieved.

It is a further object of the present invention that the optical modulator be compatible with active semiconductor circuitry. The modulator will desirably be compatible both in the sense of being similarly sized, and in that the modulator can be integrated with semiconductor devices on a common substrate.

It is yet another object of the present invention to provide an optical modulator capable of effecting phase modulation in the absence of appreciable frequency modulation.

It is still a further object of the present invention to provide an optical modulator in which a thin film resonator is integrated with a semiconductor laser diode.

SUMMARY OF THE INVENTION

These and other objects have been met with an optical modulator device comprised of a semiconductor laser acoustically coupled to a thin film resonator. The thin film resonator includes a piezoelectric crystal layer having first and second opposing surfaces, with the first opposing surface being in contact with a metallic electrode. The semiconductor laser is interposed between an acoustically reflective surface and the second surface of the thin film resonator. In a preferred embodiment the acoustically reflective surface is defined by a submount underlying a substrate upon which is mounted the semiconductor laser.

A frequency modulator exhibiting an improved modulation index may be achieved by implementing the active region of the semiconductor laser using a superlattice structure. The superlattice structure will preferably include a cascaded stack of stacked pairs, each stack pair constituent being of a thickness equivalent to a multiple of one-half of the wavelength of optical emission produced by the semiconductor laser of the superlattice.

In another aspect, the invention comprises a phase modulator disposed to provide a phase-modulated optical output of predetermined frequency. Phase modulation is produced in the absence of appreciable frequency modulation by configuring the thin film resonator to be of a longitudinal length less than that of the semiconductor laser.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1A:
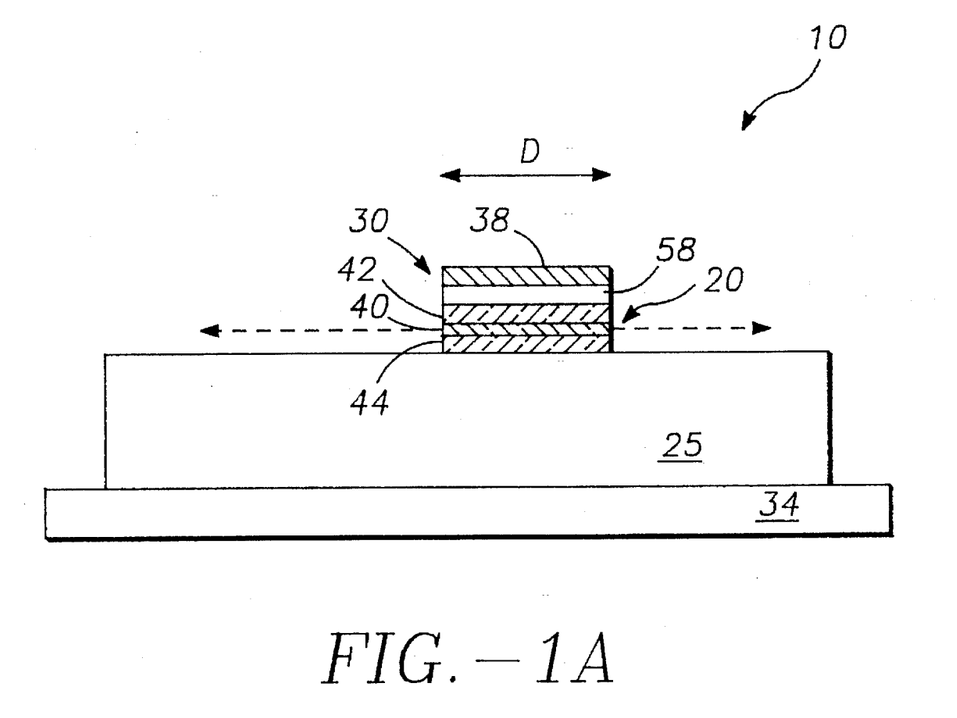
FIGS. 1A and 1B respectively provide side sectional and end views of an optical modulator in accordance with the invention.
Figure 1B:
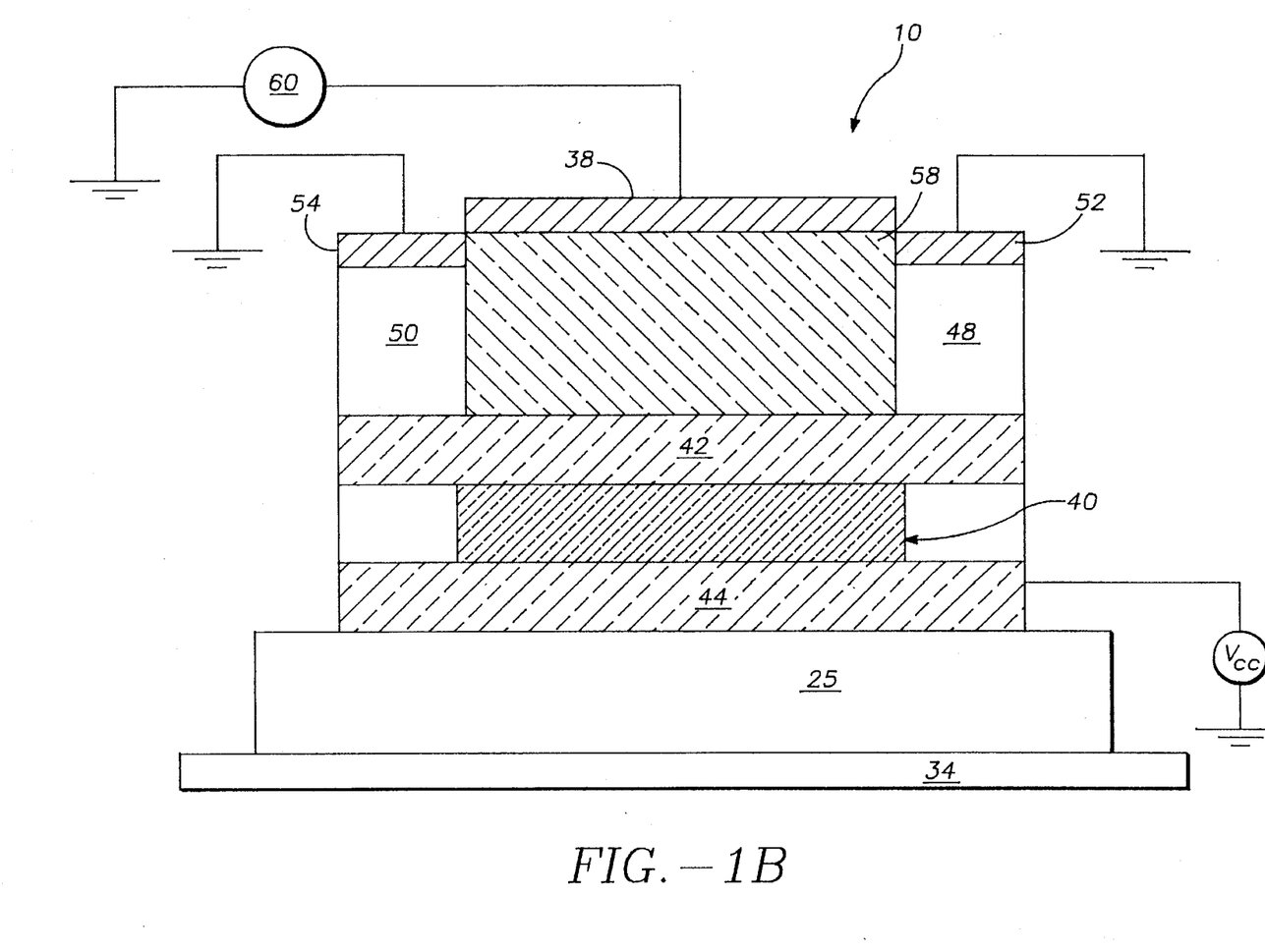

FIGS. 1A and 1B respectively provide side sectional and end views of an optical modulator 10 in accordance with the invention. The modulator 10 includes a semiconductor diode laser 20 mounted upon a dielectric substrate 25. In accordance with the invention, a thin film resonator (TFR) 30 overlying the diode laser operates to set up an acoustical standing wave between an acoustically reflective substrate submount 34 and a metallic TFR control electrode 38. The standing wave modulates the dielectric constant of active region or layer 40 of the laser 20, which results in frequency or phase modulation of the laser light L emitted by the diode laser 20. As is discussed below, the longitudinal dimension D of the TFR 30 may be adjusted in order that the laser light L is modulated either in phase or in frequency.

As is indicated by FIGS. 1A and 1B, the diode laser 20 includes N-doped and P-doped semiconductor layers 42 and 44, between which is sandwiched the active layer 40. In an exemplary embodiment the active layer 40 comprises AlGaAs, InGaAsP, or other compound semiconductor material. A pair of $N^+$ contact layers 48, 50 surrounding the TFR 30 serve to connect the N-doped layer 42 to ground through bias electrodes 52, 54. The optical modulator is laterally bounded by dielectric isolators 52, 54, which only allow laser light L to be emitted from the front and rear facets of the laser diode 20.

In conventional applications, thin film resonators are usually comprised of three basic elements: a piezoelectric dielectric, electrodes for applying electric fields, and two reflecting surfaces for establishing a standing wave. In TFR technology, thin film metallic electrodes serve both as electrodes and as reflecting surfaces with the metal/air interface at the top of the resonator serving as the primary source of reflection. Sandwiched between the two electrodes is the piezoelectric layer.

In the present invention, the TFR 30 is structured in a novel manner so as to be capable of realization using conventional planar processing techniques. More specifically, the N-doped semiconductor layer 42 allows an electric field to be developed across the piezoelectric dielectric 58 of the TFR 30 by functioning as an RF electrode opposite the TFR control electrode 38. In addition, the acoustical wave produced by the piezoelectric dielectric 58 is confined in the form of a standing wave between the TFR control electrode 38 and the submount 34. This arrangement effectively results in acoustical coupling between the TFR 30 and the diode laser active layer 40.

During device operation, a DC laser bias voltage ($V_{cc}$) is applied to the P-doped semiconductor layer 44 so as to induce lasing within the active layer 40. A high-frequency RF modulation signal (e.g., within the microwave range) from the RF source 60 is applied to the TFR control electrode 38 as a means of exciting the TFR 30. This causes the TFR 30 to resonate at the frequency of the RF source 60, and results in emission of an acoustical standing wave. In an exemplary embodiment it has been found that piezoelectric resonance at approximately 1 GHz may be obtained using a piezoelectric dielectric 58 having a thickness of about 5 μm. Similarly, the TFR 30 could be designed to operate with a resonance frequency of 5 GHz if the piezoelectric dielectric 58 were formed of aluminum nitride (AlN) or zinc oxide (ZnO) approximately 0.9 microns thick, with a 0.2 micron thick aluminum control electrode 38.

The TFR 30 may be realized using standard microelectronic fabrication techniques. In particular, the piezoelectric dielectric layer 58 may be deposited on the N-doped layer 42 using DC magnetron sputtering in the presence of a nitrogen plasma. This sputtering technique results in "c-axis" oriented piezoelectric layers, although in the lateral direction the resultant layer 58 will appear as polycrystalline. The electrode 38 (e.g., Au) is deposited upon layer 58 by way of any one of a number of conventional deposition techniques (e.g., evaporation, electron beam heating, or sputtering).

As mentioned above, during operation of the optical modulator 10 an acoustical standing wave is set up between the TFR control electrode 38 and the submount 34. The acoustical standing wave exerts time-varying pressure upon laser active layer 40, which results in a corresponding time-variation of the dielectric constant thereof. More specifically, the acoustical pressure is believed to alter the "energy gap" between the conduction and valence bands of the active layer 40. Since the dielectric constant of the laser active layer 40 is dependent upon the energy gap, it is modulated at the resonance frequency of the TFR 30. When the TFR 30 is of a longitudinal dimension D (FIG. 1A) commensurate with that of the diode laser 20, the acoustical modulation of the active layer dielectric constant results in corresponding frequency modulation of the laser light L.

Figure 2A:
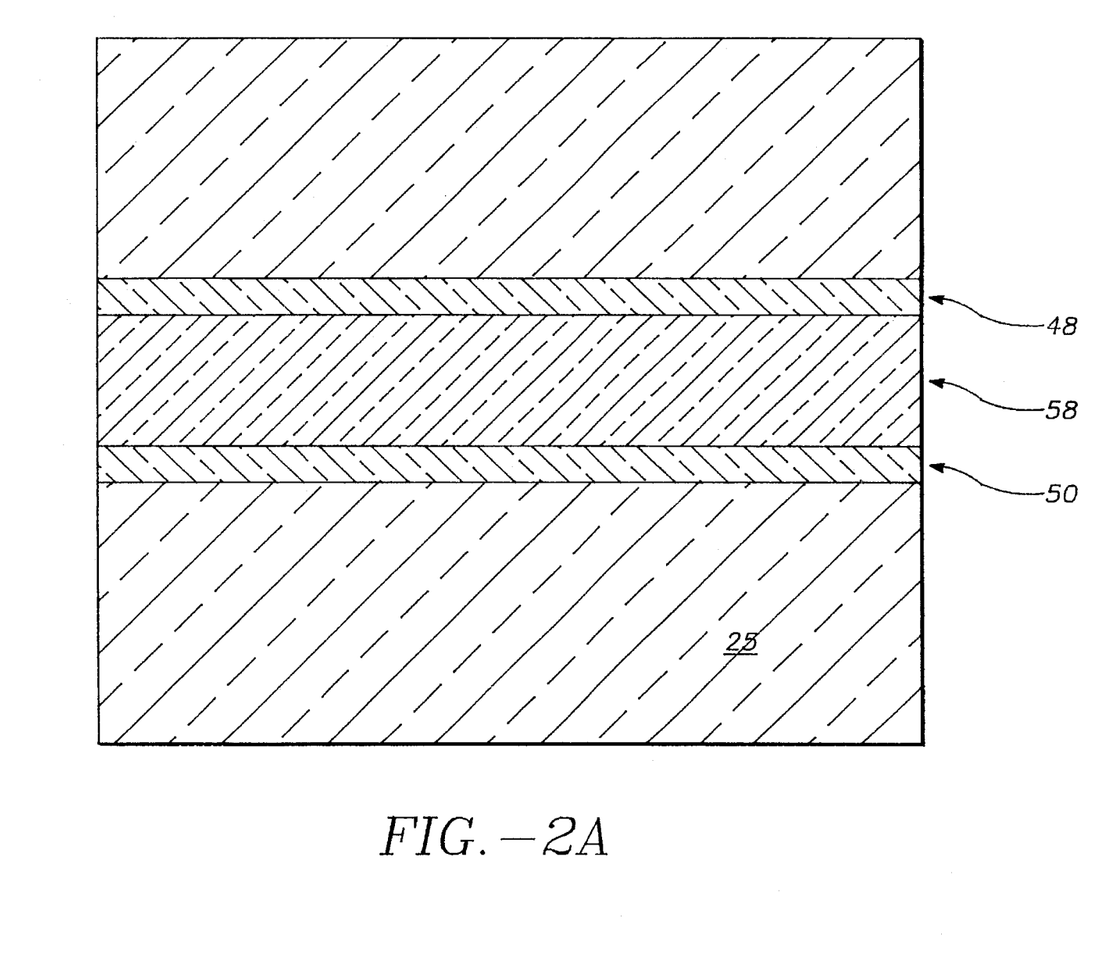
FIG. 2A shows an overhead view of an optical modulator configured to provide optical frequency modulation.

Turning now to FIG. 2A, there is shown an overhead view of an implementation of the optical modulator 10 configured to provide optical frequency modulation. In order to enhance clarity of presentation, the TFR control electrode 38 and the bias electrodes 52 and 54 have been omitted from view in FIGS. 2A and 2B. Upon excitation of the TFR 30 of FIG. 2A, the emitted acoustic wave perturbs the dielectric constant (i.e., index of refraction), and thereby modulates optical emission frequency.

Figure 2B:
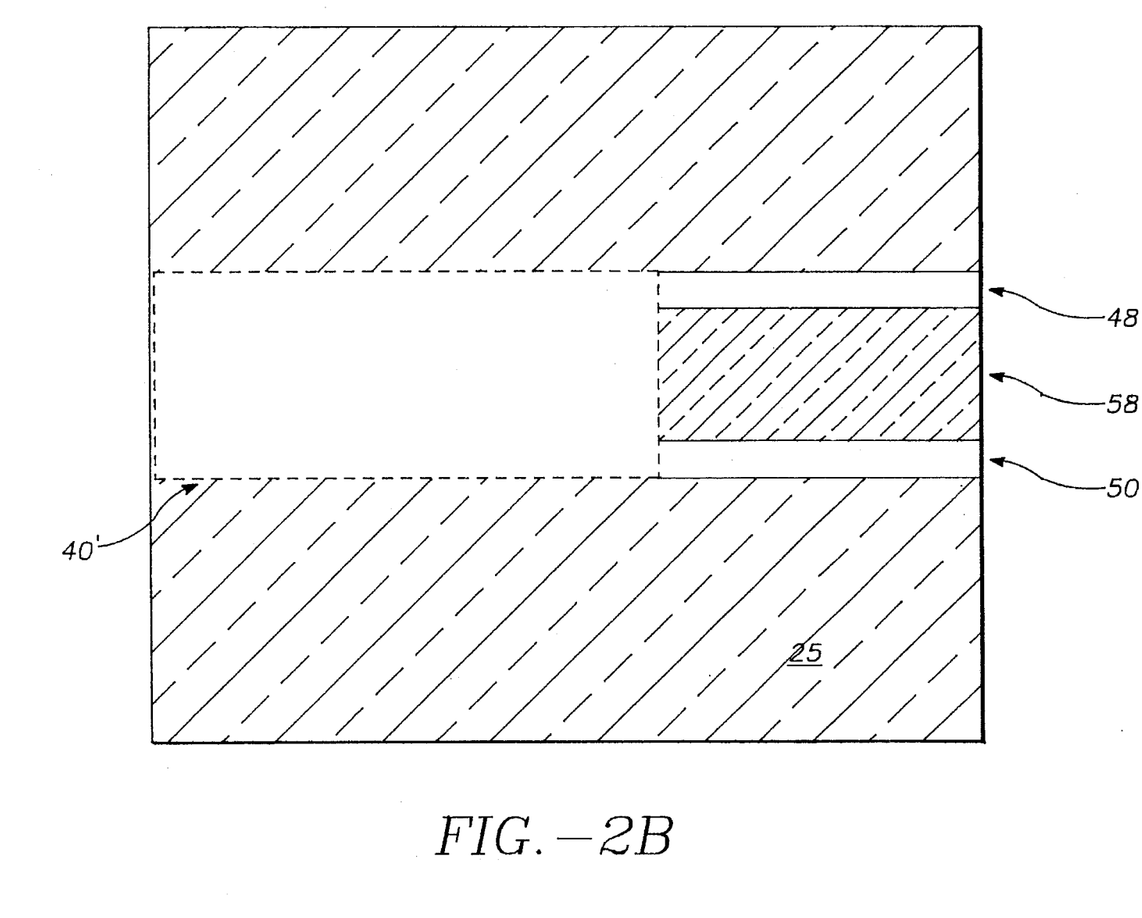
FIG. 2B shows an overhead view of an optical modulator configured to provide optical phase modulation.

In FIG. 2B, there is depicted an optical phase modulator 10' in which the TFR dielectric layer 58' extends over only a limited portion of the laser diode active layer 40'. The perturbation by the TFR 30' of the refractive index within such a localized area of the active layer 40' allows the modulator 10' to provide phase modulation without altering the optical emission frequency. In an exemplary embodiment, the TFR 30' of the phase modulator 10' covers less than approximately 50% of the lateral area of the active layer 40'.

Figure 3A:
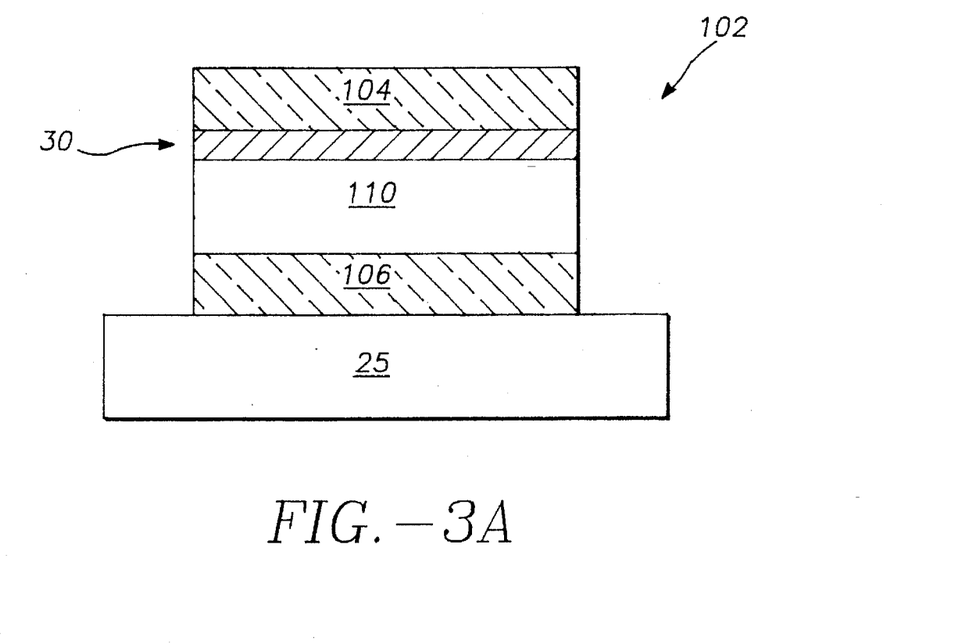
FIG. 3A shows a side sectional view of an optical modulator in which is included a diode laser having an active region comprised of a superlattice structure.

Referring now to FIG. 3A, there is shown a side sectional view of an alternate embodiment of the inventive optical modulator. Given the similarity between the optical modulators shown FIGS. 1A, 1B and FIG. 3A, like reference numerals have been employed to identify like structural components. Referring to FIG. 3A, the inventive modulator includes a semiconductor diode laser 102 mounted upon the dielectric substrate 25. The diode laser 102 includes N-doped and P-doped semiconductor layers 104 and 106, between which is sandwiched an active layer comprised of a stacked superlattice structure 110 and the TFR 30. As is described herein, the superlattice structure of active layer 110 results in an increased modulation index M, where M =Δf/$f_O$, in which Δf is equivalent to the magnitude of the frequency deviation of the frequency-modulated optical output from the optical center frequency $f_O$. Although in the embodiment of FIG. 3A the TFR 30 is shown adjacent the N-doped layer 104, the modulator of FIG. 3A may be realized using fabrication techniques similar to those described above with respect to FIG. 1B.

Figure 3B:
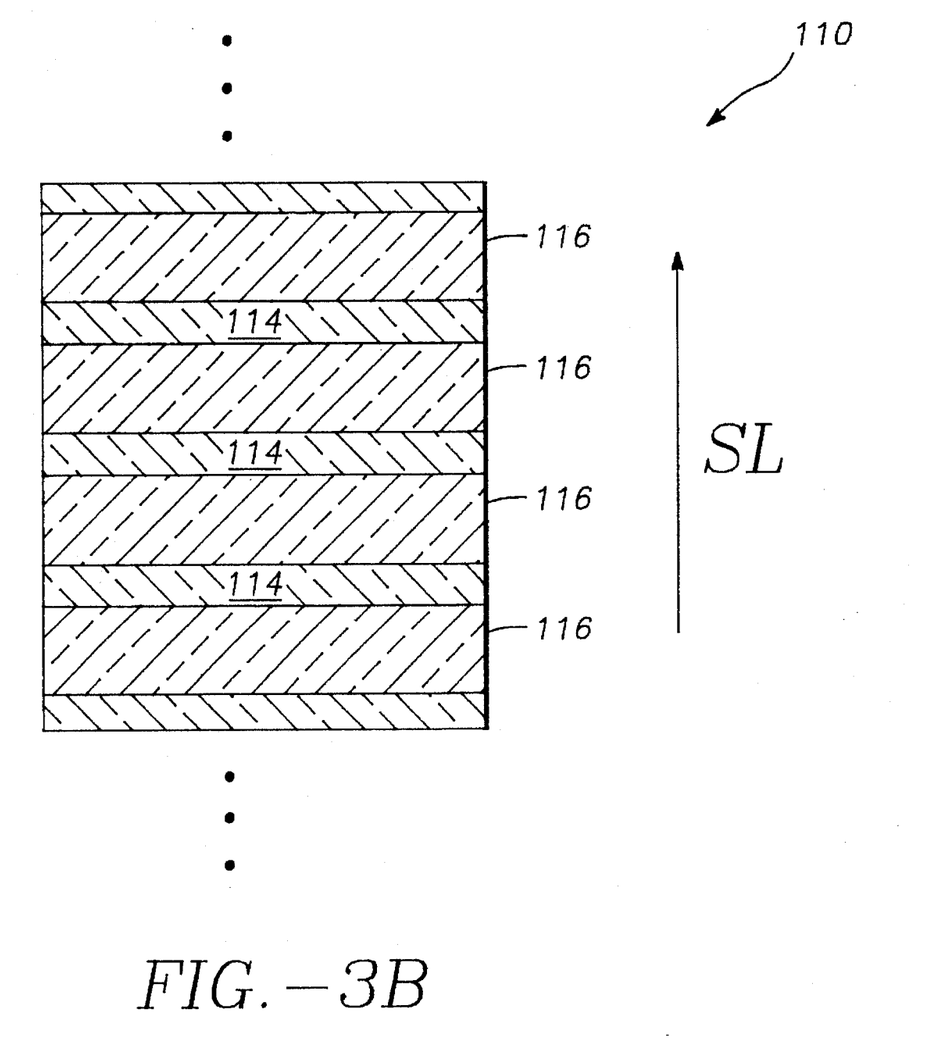
FIG. 3B provides a more detailed side sectional view of the superlattice structure within the active layer of the laser of FIG. 3A.

Turning now to FIG. 3B, a more detailed side sectional view is provided of the superlattice structure of the laser active layer 110. In an exemplary embodiment the superlattice active layer 110 is comprised of first and second alternating layers 114, 116, which are realized using different semiconductor materials of predetermined thickness d and d'. This results in the formation, in the axial superlattice direction SL, of a crystal structure of period $D_{SL}$, where $D_{SL}$=d+d'. The respective thicknesses d and d' of the first and second layers 114, 116 are selected such that the period $D_{SL}$ is equivalent to a multiple of one-half of the wavelength ($\lambda_c$) of optical emission produced by the semiconductor laser. The period $D_{SL}$ will typically be within the range of 3 to 3000 Angströms for an active layer thickness of approximately 1 to 5 microns along the superlattice axis SL.

In an exemplary embodiment the first and second layers 114, 116 are respectively comprised of, for example GaAs and $Ga_{1-x}Al_xAs$, or alternately of Si and $Si_{0.5}Ge_{0.5}$. It is understood that other pairs of semiconductor materials may also be employed without departing from the scope of the invention. Each of the first and second layers 114, 116 may be epitaxially grown using conventional molecular beam epitaxy (MBE) or molecular metal-organic chemical vapor deposition (MOCVD) techniques.

A theoretical description of the interaction of light with acoustical waves within superlattice structures is provided by, for example, Sapriel, J. and Renosi, P. in *Acousto-optics of Semiconductor Crystals and Superlattices;* SPIE Vol. 1844, Acousto-Optics and Applications (1992), pp. 126–139. It has been postulated that the increased interaction between light and acoustical waves within the superlattice, and hence the increase in modulation index M, may be at least partially attributed to:

(a) the existence of optical resonances within the superlattice, and (b) the retrodiffraction of light by the standing acoustical wave within the superlattice. Moreover, it is believed that the light/acoustic interaction length along the SL axis should be at least $4\lambda_A$ in order to obtain satisfactory diffraction efficiency, where $\lambda_A$ corresponds to the acoustical wavelength. For an active layer thickness of less than 5 microns along the SL axis, generation of the desired acoustical wavelength requires a TFR operating frequency on the order of several gigahertz (GHz).

Figure 4:
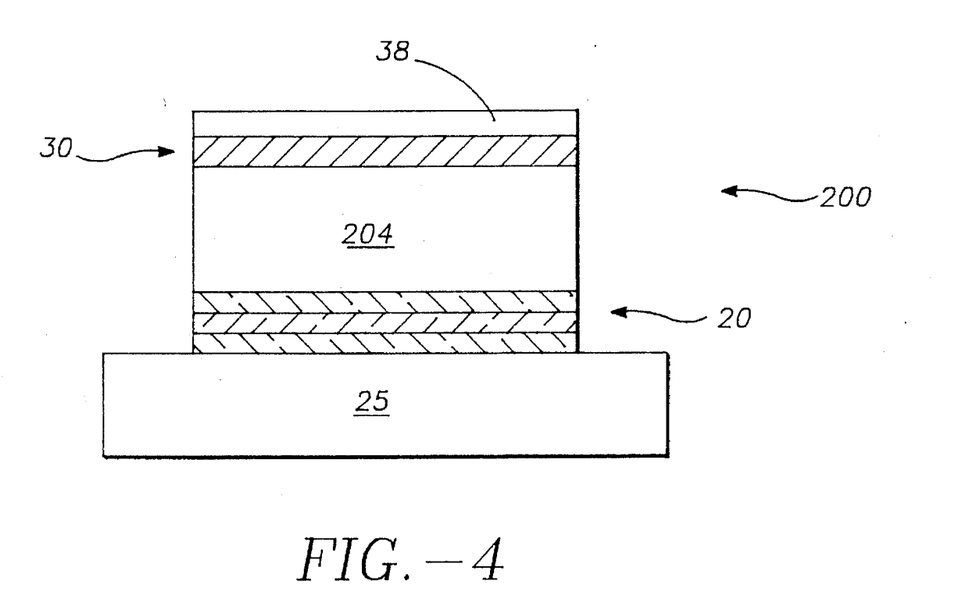
FIG. 4 depicts an optical modulator in which an acoustic stack structure is used to acoustically couple a thin film resonator to a semiconductor laser diode.

Referring now to FIG. 4, an alternate embodiment of the inventive optical modulator 200 is shown in which an acoustic stack structure 204 is interposed between the TFR 30 and semiconductor laser diode 20. The acoustic stack 204 is designed to impedance match, in an acoustical sense, the TFR 30 to the combination of the laser diode 20 and underlying substrate 25. In a preferred implementation, the acoustic stack 204 is comprised of multiple layers of non-lossless material, which potentially includes conductors, semiconductors, insulators, piezoelectrics, magnetics, and dielectrics. The thickness and characteristic impedance of the various layers are adjusted in order that the acoustical stack provide coupling between the TFR 30 and the remainder of the modulator 200.

Figure 5:
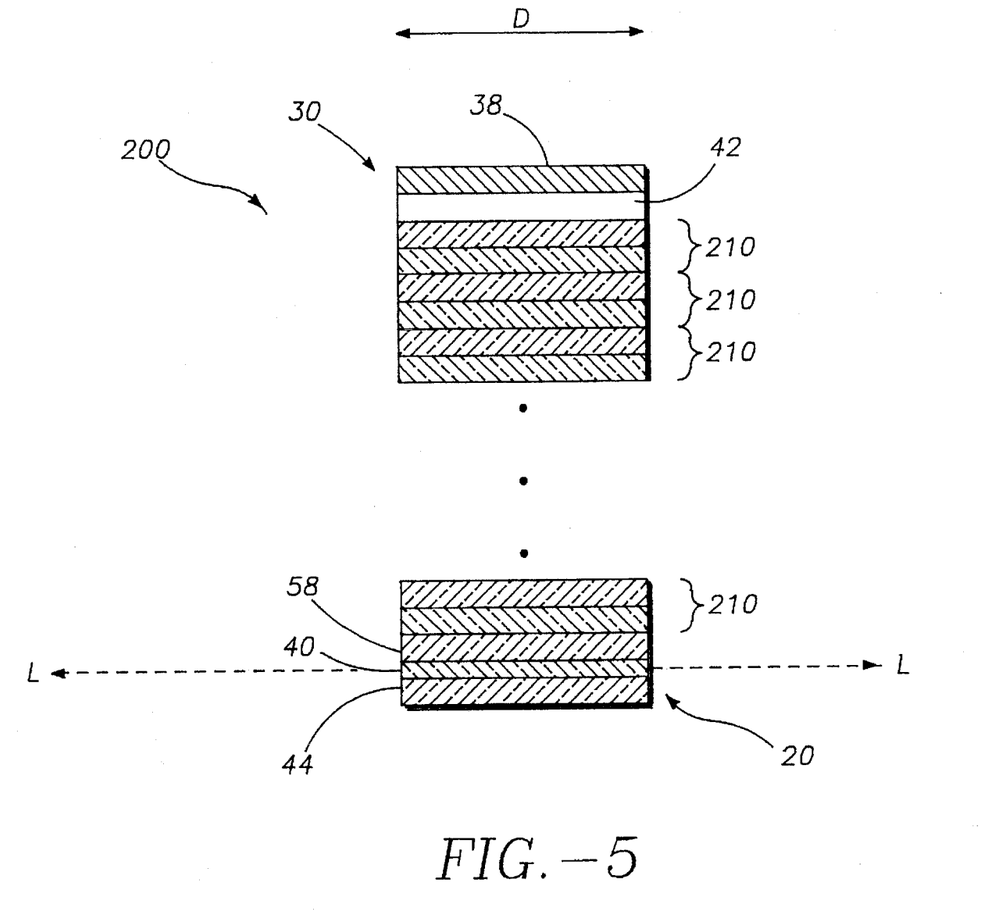
FIG. 5 provides a more detailed sectional view of the acoustic stack included within the optical modulator of FIG. 4.

Referring to FIG. 5, a more detailed sectional view is provided of the acoustic stack 204. An acoustic stack of the type included within the optical modulator 200 is disclosed in copending United States patent application Ser. No. 08/248,870, filed May 23, 1994, which is assigned to the assignee of the present invention and which is herein incorporated by reference. Briefly, the acoustic stack 204 is comprised of individual stack pairs 210, one member 214 of the pair having a higher impedance, and the other member 216 of the pair having a lower impedance. The thickness of each member 214, 216 is equal to one quarter of the wavelength of the acoustical wave produced by the TFR 30.

The acoustical stack formed of a plurality of such stack pairs presents a nominal input impedance to the TFR 30. This nominal input impedance mimics a stress free boundary condition such as would be found if the TFR were coupled to air, i.e., an acoustic short circuit. Accordingly, despite the fact that the TFR 30 is firmly in contact with the laser diode 20 through the acoustical stack, it nonetheless operates as though it were a free plate resonator. Higher power and higher frequency operation are thus possible.

In an exemplary embodiment, the acoustical stack 204 is comprised of four individual stack pairs 210, for a total of eight layers in the acoustical stack. While this exemplary embodiment assumes that the stack pairs are identical, stack pairs of different materials may be used. For a TFR resonance frequency of approximately 5 GHz, the constituent stack pair layers 214, 216 would each be of a thickness of approximately 0.3 microns, and the alternating high and low impedances selected as described in the aforementioned application Ser. No. 08/248,870.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An optical device comprising:

a thin film resonator comprising a piezoelectric crystal layer having first and second opposing surfaces, said first opposing surface being in contact with a metallic electrode;

an at least partially acoustically reflective surface; and a semiconductor laser positioned between said acoustically reflective surface and said second opposing surface of said thin film resonator, said semiconductor laser being acoustically coupled to said thin film resonator;

whereby optical energy produced by said laser is modulated in accordance with acoustical energy generated by said thin film resonator.

2. The optical device of claim 1 wherein said semiconductor laser is comprised of an active layer sandwiched between semiconductor layers of opposite conductivity type, said second surface of said thin film resonator being adjacent one of said semiconductor layers of opposite conductivity type.

3. The optical device of claim 1 wherein said semiconductor laser has opposing front and rear facets, said thin film resonator extending in a longitudinal dimension between said front and rear facets.

4. The optical device of claim 3 further including means for applying a modulation signal of predetermined frequency to said metallic electrode;

wherein frequency of said optical energy is modulated at said predetermined frequency.

5. The optical device of claim 1 wherein said semiconductor laser is bounded by front and rear facets separated in a longitudinal dimension by a cavity length of said laser, said thin film resonator extending in said longitudinal dimension over a distance less than said cavity length.

6. The optical device of claim 5 further including means for applying a modulation signal of predetermined frequency to said metallic electrode;

wherein phase of said optical energy is modulated at said predetermined frequency.

7. The optical device of claim 1 further including a substrate upon which is mounted said semiconductor laser, said substrate defining said at least partially acoustically reflective surface.

8. The optical device of claim 7 further including a planar submount upon which rests said substrate.

9. The optical device of claim 1 wherein said laser device includes an active region having at least first and second constituent layers, said first and second constituent layers having a combined thickness equivalent to a multiple of one-half of the wavelength of optical emission produced by said semiconductor laser.

10. The optical device of claim 1 wherein said semiconductor laser includes an active region in which is included a superlattice structure comprised of alternating layers of first and second predetermined thicknesses, respectively, wherein the sum of said first and second predetermined thicknesses is equivalent to a multiple of one-half of the wavelength of optical emission produced by said semiconductor laser.

11. The optical device of claim 10 wherein each of said first layers of predetermined thickness is comprised of a first semiconductor material and each of said second layers of predetermined thickness are comprised of a second semiconductor material.

12. An optical modulator comprising:

a thin film resonator comprising a piezoelectric crystal layer having first and second opposing surfaces, said first opposing surface being in contact with a metallic electrode;

a semiconductor laser having a first semiconductor layer adjacent said second surface of said piezoelectric crystal layer, a second semiconductor layer, and an active region sandwiched between said first and second semiconductor layers;

a substrate underlying said second semiconductor layer;

an acoustically reflective surface underlying said substrate; and whereby optical energy produced by said laser is modulated in accordance with acoustical energy generated by said thin film resonator.

13. The optical device of claim 12 wherein said semiconductor laser includes an active region having a superlattice structure comprised of alternating layers of first and second predetermined thicknesses, respectively, wherein the sum of said first and second predetermined thicknesses is equivalent to a multiple of one-half of the wavelength of optical emission produced by said semiconductor laser.

14. The optical device of claim 12 further including:

a pair of doped semiconductor regions laterally adjacent said thin film resonator, said pair of doped semiconductor regions being mounted upon said semiconductor laser;

means for supplying bias to said semiconductor laser through said pair of doped semiconductor regions.

15. An optical phase modulator comprising:

a thin film resonator comprising a piezoelectric crystal layer having first and second opposing surfaces, said first opposing surface being in contact with a metallic electrode wherein said thin film resonator is of a first longitudinal length;

a semiconductor laser having a first semiconductor layer adjacent said piezoelectric crystal layer, a second semiconductor layer, and an active region sandwiched between said first and second semiconductor layers wherein said semiconductor laser is of a second longitudinal length exceeding said first longitudinal length;

a substrate underlying said second semiconductor layer; and an acoustically reflective surface underlying said substrate;

whereby optical energy produced by said laser is modulated in accordance with acoustical energy generated by said thin film resonator.

16. An optical device comprising:

a thin film resonator comprising a piezoelectric crystal layer having first and second opposing surfaces, said first opposing surface being in contact with a metallic electrode;

a semiconductor laser;

an acoustical stack disposed between and joining the thin film resonator and the semiconductor laser and comprising multiple layers of material, each layer having a characteristic thickness and impedance and being composed of a non-lossless material, the characteristic thicknesses and impedances of the layers being adjusted to determine the input impedance presented to the thin film resonator; and an acoustically reflective surface underlying the semiconductor laser.

17. The optical device of claim 16 further including a substrate interposed between the acoustically reflective surface and the semiconductor laser, wherein the multiple layers have characteristic thicknesses and impedances adjusted to cause the acoustical stack impedance to match the thin film resonator to the laser diode and substrate, thereby acoustically coupling the thin film resonator to the laser diode and substrate.

18. The optical device of claim 16 wherein the multiple layers comprise at least six layers of material, the characteristic thicknesses and impedances of which are adjusted to cause the acoustical stack to acoustically couple the thin film resonator to the semiconductor laser diode.

* * * * *